United States Patent [19]
Mori et al.

[11] Patent Number: 5,118,944
[45] Date of Patent: Jun. 2, 1992

[54] INFRARED RAY SENSOR AND METHOD OF MANUFACTURING THE SAME

[75] Inventors: Takehisa Mori; Hisanaga Kiba, both of Nakai, Japan

[73] Assignee: Terumo Kabushiki Kaisha, Tokyo, Japan

[21] Appl. No.: 686,439

[22] Filed: Apr. 17, 1991

[30] Foreign Application Priority Data

Apr. 18, 1990 [JP] Japan ................................. 2-100454
Oct. 26, 1990 [JP] Japan ................................. 2-287105

[51] Int. Cl.⁵ ........................................... G01J 5/02
[52] U.S. Cl. .................................. 250/338.4; 250/349; 250/370.01
[58] Field of Search ............... 250/349, 338.4, 370.01

[56] References Cited

U.S. PATENT DOCUMENTS 3,949,223  4/1976  Schmit et al. .................... 250/211 J
4,792,682  12/1988  Endou et al. .................... 250/349

FOREIGN PATENT DOCUMENTS 214289  8/1989  European Pat. Off.

OTHER PUBLICATIONS

Patent Abstracts of Japan, vol. 10, No. 183, Kokai 61-30730, Feb. 1986.
Patent Abstracts of Japan, vol. 12, No. 163, Kokai 62-277528, May, 1986.
European Search Report, EP 91401037.6

*Primary Examiner*—Carolyn E. Fields
*Attorney, Agent, or Firm*—Burns, Doane, Swecker & Mathis

[57] ABSTRACT

Disclosed is an infrared ray sensor and a method of manufacturing the same. The infrared ray sensor includes a sensor substrate formed of an infrared ray transmitting material and having a first surface and a second surface which is in opposed relation to the first surface, an infrared ray reflecting film provided on the first surface of the sensor substrate, infrared ray detecting elements provided on the second surface of the sensor substrate, and an infrared ray transmitting window formed in the infrared ray reflecting film in relation to the infrared ray detecting elements. The infrared ray which enters the infrared ray transmitting window portion passes through the sensor substrate and is then made incident on the infrared ray detecting elements. Bridges are formed on the second surface of the sensor substrate. Each of the bridges is a silicon oxynitride film having a single layer configuration.

15 Claims, 5 Drawing Sheets

INFRARED RAY SENSOR AND METHOD OF MANUFACTURING THE SAME

BACKGROUND OF THE INVENTION

The present invention relates to an infrared ray sensor for measuring the temperature of an object whose temperature is to be measured in a non-contact state and a method of manufacturing such as infrared ray sensor.

Infrared ray sensors designed to form an infrared ray detecting element (temperature sensing element) on a bridge above a substrate are known. Such infrared ray sensors exhibiting an improved sensitivity have been proposed in, for example, Japanese Patent Laid-Open Nos. 178149/1982 and 277528/1987.

Infrared ray sensors designed to provide a plurality of infrared ray detecting elements on bridge substrates have also been proposed. In such infrared ray sensors, infrared radiation is made incident on half of the plurality of infrared ray detecting elements while it is not made incident on the remaining half thereof, and the difference in the two outputs is calculated. Consequently, adverse effect of the disturbance can be eliminated, and sensitivity can thus be improved.

Such conventional infrared ray sensors, having a plurality of infrared ray detecting elements so that a difference between the output of the infrared ray detecting element to which infrared radiation is made incident and that of the infrared ray detecting element to which no infrared radiation is made incident can be produced, have the following concrete configuration.

That is, two ceramic substrates each of which has an infrared ray detecting element formed thereon are accommodated in a hermetic package having a window through which infrared radiation enters. One of the substrates is connected to the distal ends of the terminal pins of the hermetic package in a state in which the infrared ray detecting element thereof faces the window so that infrared radiation can enter the element. The other substrate is connected to the distal ends of the terminal pins of the hermetic package at a position separated from the window so that no infrared radiation enters its infrared ray detecting element. The difference in the output between the two infrared ray detecting elements is calculated, by which adverse effect of the disturbance can be eliminated.

In recent years, attempts have been made to manufacture supersmall infrared ray sensors by utilizing the semiconductor microfabrication technologies. Photolithographic and etching technologies are used to form very small bridge structures on each of which an infrared ray detecting element is formed. In this sensor, the bridges each of which has the infrared ray detecting element formed thereon are formed on one surface of the sensor substrate, and infrared radiation is detected from the difference in the output between the infrared ray detecting element on which infrared radiation is made incident and the infrared ray detecting element on which no infrared radiation is made incident, as in the former infrared ray sensor.

However, the above-described conventional infrared ray sensors have the following drawbacks.

In the configuration of the type in which the substrates are accommodated in the hermetic package, connection of the individual substrates to the terminals of the hermetic package makes manufacture of the sensor very difficult in terms of workability and reproducibility of the position of the elements.

Furthermore, one of the infrared ray detecting elements must be disposed at the position where it does not face the window of the hermetic package in a state where it is separated from the package case through a predetermined distance. Also, it is difficult to maintain the positional relation between the two infrared ray detecting elements in an adequate state. This causes a slight amount of infrared radiation to be made incident on the infrared ray detecting element to which no infrared radiation is to be made incident. The amount of infrared radiation which is incident on that infrared ray detecting element varies depending on the sensors. These necessitate inspection and correction to be made on the assembled sensors, thus increasing amount of labor required to manufacture an infrared ray sensor exhibiting excellent characteristics.

In the conventional infrared ray sensor manufactured by utilizing the semiconductor microfabrication technologies, it is very difficult to make infrared radiation incident on one of the infrared ray detecting elements and to make no infrared radiation incident on the other because of its very small size. Accordingly, it is practiced to form a film made of a material which reflects infrared radiation, such as gold (Au) on one of the bridges.

However, provision of the reflecting film on the bridge changes the heat conducting state of the individual bridges, and this makes production of real difference in the output impossible. It is therefore difficult to obtain a stable output, because of the advance effect of the disturbance.

Also, in the latter conventional infrared ray sensor, the bridges and the substrates are made of the same material from the viewpoint of facilitation of manufacture and provision of strength. In this case, since there is no difference in the coefficient of thermal conductivity between the silicon substrates and the infrared ray detecting elements, the light receiving area of the sensor must be increased in order to obtain an output at a sufficient level. Alternatively, the portion of the sensor from which heat escapes must be reduced. Conventionally, it is therefore difficult to reduce the size of the sensor device.

To achieve reduction in the size of the sensor device, the bridges are formed of a material having a smaller coefficient of thermal conductivity than the substrate material. If the substrates are made of silicon, silicon oxide or silicon nitride film may be used.

However, in the infrared ray sensor having the above-described structure, stress may be generated in the film during the manufacturing process due to a difference in the coefficient of thermal expansion between the silicon substrate and the silicon oxide or silicon nitride film. This leads to breakage of the bridge. To prevent breakage, a laminated configuration of the silicon oxide or silicon nitride film which is capable of cancelling the stress may be adopted. However, such a laminated configuration is complicated, and is readily affected by variations in the film thickness, resulting in decrease in the yield of the manufacture of bridge structure. Also, manufacture of such a film requires the very troublesome process.

For selective etching of the laminated film made of silicon oxide and that of silicon nitride, which is conducted to obtain in the bridge structure, different etchants and different etching conditions are used. This makes etching process complicated and difficult.

SUMMARY OF THE INVENTION

Accordingly, an object of the present invention is to provide an infrared ray sensor which can eliminate provision of a reflecting film on a bridge and which enables infrared radiation to be made incident only on specified infrared ray detecting element reliably so as to prevent adverse effect of the disturbance.

Another object of the present invention is to provide an infrared ray sensor which enables the output of an infrared ray detecting element to be taken out easily and which is small in size.

Another object of the present invention is to provide an infrared ray sensor whose bridge structure is of the single layer and is not readily broken.

Another object of the present invention is to provide an infrared ray sensor which enables the manufacturing process to be simplified and which enables the optimum film forming conditions to be readily obtained so as to achieve improvement in the yield of the bridge formation.

Other objects and advantages of the present invention will become apparent from the following description taken in connection with the accompanying drawings.

The present invention provides an infrared ray sensor which comprises a sensor substrate formed of a material which transmits infrared ray and having a first surface and a second surface which is in opposed relation to the first surface, an infrared ray reflecting film provided on the first surface of the sensor substrate, an infrared ray detecting element provided on the second surface of the sensor substrate, and an infrared ray transmitting window formed in the infrared ray reflecting film in relation to the infrared ray detecting element for making infrared ray which enters the infrared ray transmitting window incident on the infrared ray detecting element through the sensor substrate.

In the above configuration, two or more of the infrared ray detecting elements may be provided on the second surface of the sensor substrate, and the infrared ray transmitting window may be formed at a position where it allows the infrared ray to enter a specified infrared ray detecting element alone in the plurality of infrared ray detecting elements.

In the above configuration, a plurality of bridges may be formed on the second surface of the sensor substrate. The infrared ray detecting elements may respectively be provided on the plurality of bridges one on each bridge.

According to the infrared ray sensor of the present invention, it is possible to make the infrared ray incident on the specified infrared ray detecting element alone and not to make the infrared ray incident on the remaining infrared ray detecting element at all. Therefore, it is not necessary to provide the infrared ray reflecting film on the bridge which would be required in the conventional sensor not to make the infrared ray incident, and the individual infrared ray detecting elements can thus be held under the same environment. Consequently, a stable output which is not affected by the disturbance can be obtained by calculating the difference between the output of the infrared ray detecting element on which the infrared ray is incident and the output of the infrared ray detecting element on which no infrared ray is made incident.

In the infrared ray sensor according to the present invention, electrode pads may be formed on the second surface of the sensor substrate, and be electrically connected to the infrared ray detecting elements. At that time, a terminal substrate having conductive layers at positions corresponding to the electrode pads on the sensor substrate and electrode terminals respectively connected to the conductive layers may be provided. The sensor substrate is fixed to the terminal substrate in a state wherein the electrode pads of the sensor substrate are joined to the conductive layers of the terminal substrate.

In the infrared ray sensor according to the present invention, the sensor substrate can be joined to the terminal substrate on which the conductive layers are formed at the positions corresponding to the electrode pads in a face down bonding fashion. This facilitates taking out of the outputs of the infrared ray detecting elements, and reduces the overall size of the infrared ray sensor.

Furthermore, the surface of the terminal substrate to which the sensor substrate is joined has a hole portion, and the surrounding of the hole portion is sealed completely when the sensor substrate is joined to the terminal substrate. Therefore, when this joining work is done in a vacuum, the infrared ray detecting elements can be sealed in a vacuum. This enhances the heat insulation between the infrared ray detecting elements and the air and further improves the sensitivity and accuracy of the infrared ray sensor.

In the infrared ray sensor according to the present invention, the infrared ray reflecting film may be a film of a metal exhibiting efficient reflection, such as gold (Au). The infrared ray transmitting material may be a semiconductor material, such as silicon or germanium. The use of silicon which is available at a cheap cost is desired.

Furthermore, in the infrared ray sensor according to the present invention, each of the bridges may be a silicon oxynitride ($SiO_x N_y$) film capable of balancing stress. The silicon oxynitride film may have a single-layer configuration.

In this way, a stable bridge structure can be obtained.

The silicon oxynitride film possesses the characteristics of a silicon oxide film and those of a silicon nitride film, is hence capable of balancing stress, and provides a stable bridge structure.

The optimum silicon oxynitride film forming conditions vary depending on the type of substrate used because of difference in the coefficient of heat expansion caused by the difference in the substrate material or in the crystal face direction.

Therefore, in the infrared ray sensor according to the present invention, the composition of the silicon oxynitride film, the values x and y of stoichiometric composition, are changed in accordance with the material of the sensor substrate. In this way, a bridge structure having the optimum film composition can be obtained in accordance with the composition of the sensor substrate.

In the infrared ray sensor according to the present invention, the thickness of the silicon oxynitride film may be between 0.1 and 50 μm. A film having a thickness of less than 0.1 μm is too thin and is thus not sufficiently strong. A film which is 50 μm or more thick has a large amount of heat capacity, and hence has deteriorated sensitivity.

An infrared ray sensor according to the present invention may also comprise a sensor substrate formed of a semiconductor material, a bridge formed of a silicon oxynitride film, the bridge being provided on the sensor substrate, and an infrared ray detecting element provided on the bridge.

The present invention further provides a method of manufacturing an infrared ray sensor, which comprises the steps of forming a silicon oxynitride film by causing a reactive gas to flow on a semiconductor substrate, patterning the silicon oxynitride film, and forming a hole portion by selectively removing a portion of the semiconductor substrate located below the patterned silicon oxynitride film so as to form a bridge made of the silicon oxynitride film Formation of the silicon oxynitride film is conducted by, for example, plasma CVD (chemical vapor deposition) process. This process employs monosilane ($SiH_4$), nitrogen ($N_2$) and laughing gas ($N_2O$). In this process, the stoichiometiric composition x, y of the silicon oxynitride film can be controlled by changing the gas flow rate ratio ($N_2/N_2+N_2O$) between $N_2$ and $N_2O$, and the difference in the coefficient of thermal expansion between the sensor substrate and the silicon substrate can thus be reduced to substantially zero. This enables prevention of breakage of the sensor due to stress.

According to the manufacturing method of the present invention, the composition of the silicon oxynitride film is changed in accordance with a coefficient of thermal expansion of the semiconductor substrate by changing a gas flow rate ratio of the reactive gas.

Formation of the silicon oxynitride film may also be conducted by sputtering. In the sputtering process, a silicon oxynitride film is grown as the silicon oxide as the target. A mixture of argon (Ar) and nitrogen ($N_2$) may be used as the sputtering gas. The use of this mixture enables the composition of the silicon oxynitride film to be changed.

BRIEF DESCRIPTION OF THE DRAWINGS

FIGS. 7(A) to 7(F) are respectively cross-sectional views showing the manufacturing process of the infrared ray sensor.

DESCRIPTION OF THE PREFERRED EMBODIMENT

An embodiment of the present invention will now be described with reference to the accompanying drawings.

As shown in FIGS. 1 to 4, a sensor device 1 has a substantially square silicon substrate 2 whose one side is about 3 mm long.

A front surface 2a, i.e., a first surface, of the silicon substrate 2 is covered with an infrared ray reflecting film 4 for reflecting infrared radiation except for the portion thereof which forms an infrared ray transmitting window portion 3. The infrared ray reflecting film 4 is made of gold, platinum, silver, aluminum, titanium or molibdenum, chromium and is 50 nm to 2000 nm thick. Various methods, such as vapor deposition, sputtering, ion plating, ion beam sputtering, CVD process (chemical vapor deposition process) and plating, can be used for forming the infrared red reflecting film 4. The infrared ray transmitting window portion 3 is covered with a film 4a which prevents a incident infrared ray reflecting. The film 4a is made of ZnS, ZnSe and LiF, and 0.1~30 μm thick. Various methods, such as vapor deposition, sputtering, ion plating, ion beam sputtering, CVD, can be used for forming the film 4a.

A rear surface 2b, i.e., a second surface, of the silicon substrate 2 has a hole portion 5 having substantially upright side walls and a flat bottom wall at a center thereof. Two parallel bridges 6A and 6B are respectively laid across the hole portion 5. Each of the bridges 6A and 6B is a silicon oxynitride film having a width of 100 μm, a length of 2 mm and a thickness of 2 μm. The silicon oxynitride film which forms the bridges 6A and 6B is also formed on the rear surface 2b of the silicon substrate 2 except for the hole portion 5. That is, the rear surface 2b of the silicon substrate 2 is level with the surface of the bridges 6A and 6B.

Infrared ray detecting elements 7A and 7B are respectively provided on the bridges 6A and 6B at the central portion thereof. Each of the infrared ray detecting elements 7A and 7B is a film made of amorphous silicon (a-Si), polycrystal silicon or germanium (for example; amorphous germanium (a-Ge)) and having a thickness of 100 to 3000 nm. An amorphous germanium is preferably used for the infrared ray detecting elements 7A and 7B in order to be joined to electrode lines 8 and to get a large coefficient of B. The B is shown by below formula;

$$R = R_0 \cdot \exp(B/(1/T - 1/T_0))$$

where $T_0$ is 0° K., T is an absolute temperature (° K.), $R_0$ is a resistance value at 0° K. and R is a resistance value at T ° K.

Various methods including sputtering, ion beam sputtering and CVD process can be used to form the infrared ray detecting elements 7A and 7B. The infrared ray transmitting window portion 3 is formed in the infrared ray reflecting film 4 at a position where it allows infrared radiation to enter only one infrared ray detecting element 7B. Therefore, the infrared radiation which passes through the infrared ray transmitting window portion 3 is not made incident on the other infrared ray detecting element 7A at all.

Figure 1:
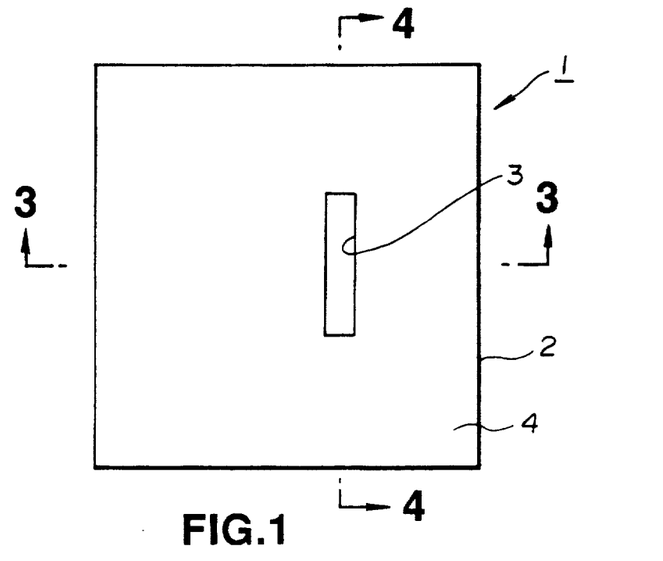
FIG. 1 is a plan view of an embodiment of an infrared ray sensor according to the present invention.
Figure 2:
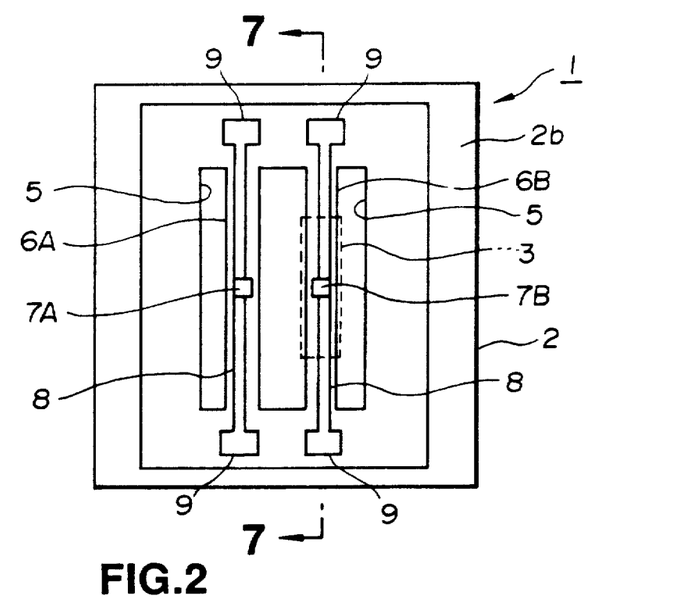
FIG. 2 is a rear view of the infrared ray sensor of FIG. 1.
Figure 3:
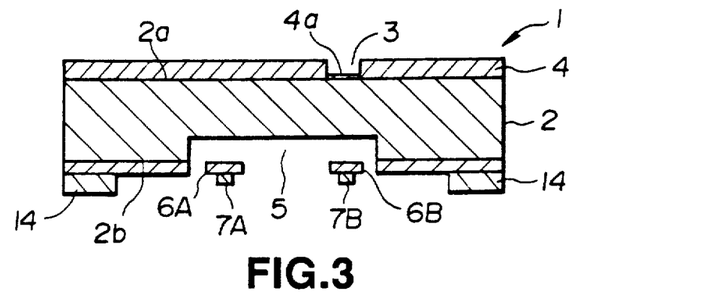
FIG. 3 is a cross-section taken along the line 3—3 of FIG. 1.
Figure 4:
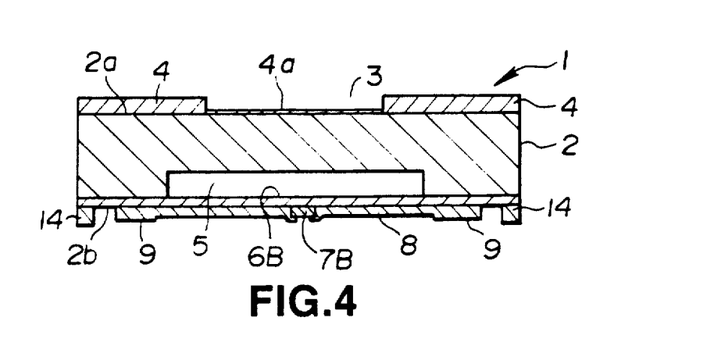
FIG. 4 is a cross-section taken along the line 4—4 of FIG. 1.

Electrode lines 8 are respectively led from the infrared ray detecting elements 7A and 7B along the bridges 6A and 6B. The electrode lines 8 are respectively connected to electrode pads 9 formed at the peripheral portion of the silicon substrate 2. The electrode lines 8 and the electrode pads 9 are each formed of titanium, molybdenum, aluminum, chromium, copper, nickel, tantalum, tungsten or polysilicon to a thickness of 50 to 4000 nm using sputtering, ion beam sputtering or CVD process.

Figure 5:
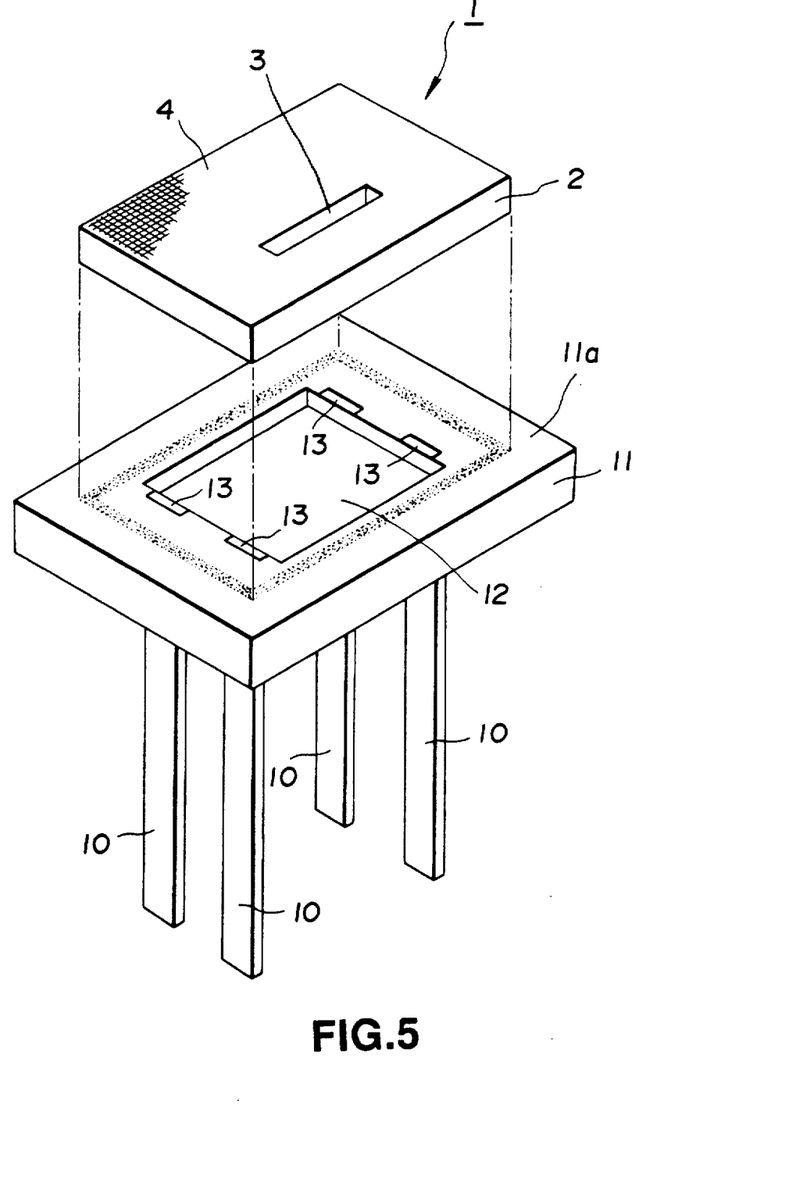
FIG. 5 is an exploded perspective view of the infrared ray sensor.
Figure 6:
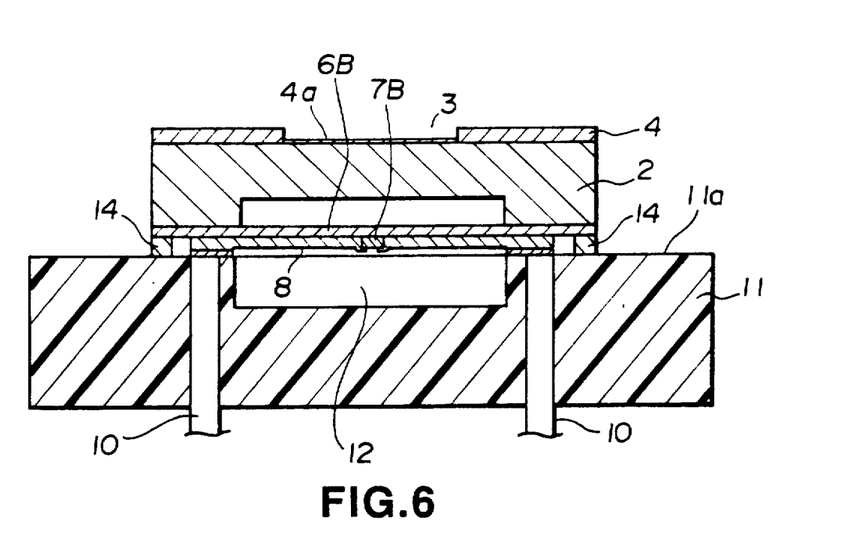
FIG. 6 is a cross-sectional view of the infrared ray sensor.

The sensor device 1 having the above-described configuration is fixed to a terminal substrate 11 having four terminal pins 10, as shown in FIGS. 5 and 6. An upper surface 11a of the terminal substrate 11 has a hole portion 12 which is slightly larger in size than the hole portion 5 in the silicon substrate 2. Also, the upper surface 11a of the terminal substrate 11 has conductive layers 13 formed around the hole portion 12 at positions corresponding to the electrode pads 9 of the silicon substrate 2. The conductive layers 13 are electrically connected to the upper end portions of the terminal pins 10, respectively. An adhesive 14 made of, for example, an epoxy resin is coated on the rear surface 2b of the silicon substrate 2 on the peripheral portion thereof, by which the silicon substrate 2 is adhered and mechanically fixed to the upper surface 11a of the terminal substrate 11 at a predetermined position. At the same time, the electrode pads 9 of the silicon substrate 2 are respectively laid on and electrically connected to the conductive layers 13 of the terminal substrate 11 by means of soldering or the like.

The silicon substrate 2 may also be joined to the terminal substrate 11 using anode process or solder sealing. If jointing work of the silicon substrate 2 to the terminal substrate 11 is conducted in a vacuum, the infrared ray detecting elements 7A and 7B can be held in a vacuum. Jointing work of the silicon substrate 2 to the terminal substrate 11, which is conducted in an inactive gas, such as nitride, helium or argon, allows the infrared ray detecting elements 7A and 7B to be held in the inactive gas.

In the infrared ray sensor arranged in the manner described above, the infrared ray detecting elements 7A and 7B are provided on the rear surface 2b of the silicon substrate 2, and the infrared ray reflecting film 4 with the infrared ray transmitting window portion 3 formed in opposed relation to the infrared ray detecting element 7B is coated on the front surface 2a of the silicon substrate 2, as stated above. Infrared radiation which enters the infrared ray transmitting window portion 3 passes through the silicon substrate 2 and is then made incident on the specified infrared ray detecting element 7B alone. It is therefore possible to make infrared radiation enter only one infrared ray detecting element 7B and to make no infrared radiation to enter the other infrared ray detecting element 7A at all.

Consequently, it is not necessary to provide an infrared ray reflecting film on the bridge in order to block infrared radiation, unlike the conventional sensor element, and the individual infrared ray detecting elements can thus be held under the same environments. As a result, a stable output which is not affected by the disturbance can be obtained by calculating the difference between the output of the infrared ray detecting element 7B on which infrared radiation is made incident and that of the infrared ray detecting element 7A on which no infrared radiation is made incident.

Furthermore, in the above-described infrared ray sensor, since the electrode pads 9 electrically connected to the infrared ray detecting elements 7A and 7b are formed on the rear surface 2b of the silicon substrate 2, the sensor substrate 2 can be joined to the terminal substrate 11 on which the conductive layers 13 are formed at the positions corresponding to the electrode pads 9 in a face down bonding fashion. This facilitates taking out of the output of the infrared ray detecting elements 7A and 7B, and reduces the overall size of the infrared ray sensor.

Furthermore, the upper surface of the terminal substrate 11 to which the silicon substrate 2 is joined has the hole portion 12, and the hole portion 12 is completely sealed when the silicon substrate 2 is joined to the terminal substrate 11. Also, this jointing work is conducted in a vacuum so that the infrared ray detecting elements 7A and 7B can be sealed in a vacuum. Consequently, heat insulation between the infrared ray detecting elements 7A and 7B and the air can be enhanced, and the sensitivity and accuracy of the infrared ray sensor can thus further be improved.

Furthermore, in the above-described infrared ray sensor, the bridges 6A and 6B are of the single layer type and are formed of silicon oxynitride which assures balanced stress. Consequently, the difference in the coefficient of thermal expansion between the bridges and the silicon substrate can be substantially reduced to zero. This provides a stable bridge structure and eliminates breakage of the bridges which would otherwise occur during the manufacturing process.

Figure 7A:
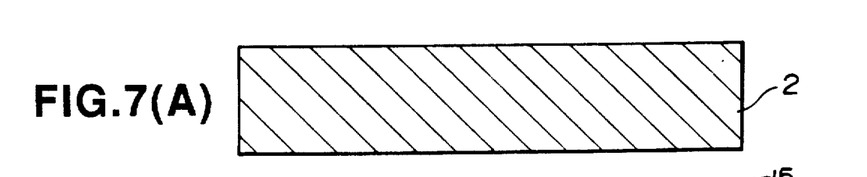
Figure 7B:
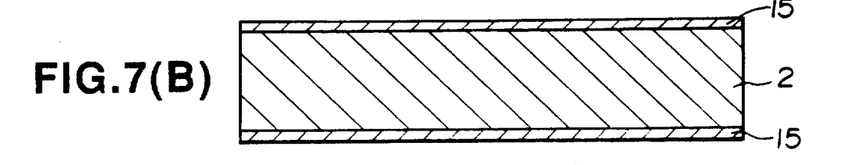

FIGS. 7(A) to 7(F) show the manufacturing process of the infrared ray sensor according to the present invention. First, the silicon substrate 2 having a face direction (110) was prepared, as shown in FIG. 7(A). Next, a silicon oxynitride film ($SiO_xN_y$) 15 was formed on the two surfaces of the silicon substrate 2 to a thickness of 2 $\mu$m by plasma CVD process, as shown in FIG. 7(B). That is, the silicon substrate 2 was heated to 450° C., and then vapor growth of silicon oxynitride on the silicon substrate 2 was performed under a pressure of 0.45 Torr using as the reactive gas monosilane ($SiH_4$), nitride ($N_2$) and laughing gas ($N_2O$). The high frequency output was 400 W. The flow rates of nomosilane, nitride and laughing gas were respectively 15 SCCM, 203 SCCM and 32 SCCM.

The thus-formed silicon oxynitride film 15 was analyzed by Rutherform backscattering spectrometry. The composition of the film was $SiO_{1.20}N_{0.677}$.

Subsequently, the silicon oxynitride films were patterned to obtain the bridge patterns 6A and 6B shown in FIG. 1. This patterning may be conducted until the silicon substrate 2 is exposed by, for example, reactive ion etching (RIE). Methan trifluoride ($CHF_3$) and oxygen ($O_2$) were used as the etching gas. The flow rate of the methan trifluoride was 47.5 SCCM, and that of oxygen was 2.5 SCCM. The pressure applied during the etching was 0.075 Torr and the high-frequency output was 150 W. Etching continued three hours.

Figure 7C:
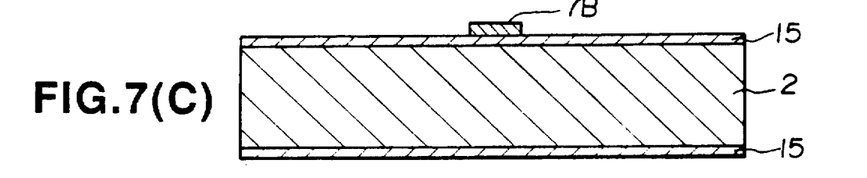

Therefore, the infrared ray detecting element 7B shown in FIG. 7(C) was repectively formed on the bridges 6A and 6B at the central portion thereof. That is, an amorphous germanium (a-Ge) was formed on the silicon oxynitride film 15 and the silicon substrate 2 by conducting sputtering using germanium as the target. Argon (Ar) and hydrogen ($H_2$) were used at the flow rate of 2 SCCM and 1 SCCM. The pressure was $3 \times 10^{-3}$ Torr, and the high-frequency output was 200 W. Sputtering continued for ten minutes.

Next, annealing was conducted at 500° C. for 20 minutes to make amorphous silicon polycrystalline. Subsequently the polycrystalline silicon film was patterned by reactive ion etching. Therefore, the electrode pads 9 shown in FIG. 7(D) were formed by forming an aluminum film on the surface of the silicon substrate 2 by vapor deposition and then by patterning the film.

Next, the silicon substrate 2 located below the bridges 6A and 6B was selectively removed by etching to form the hole portion 5 shown in FIG. 7(E). This etching was anisotropic etching which used aqueous solution of hydrogine. This anisotropic etching may also use aqueous solution of potassium hydroxide.

Figure 7D:
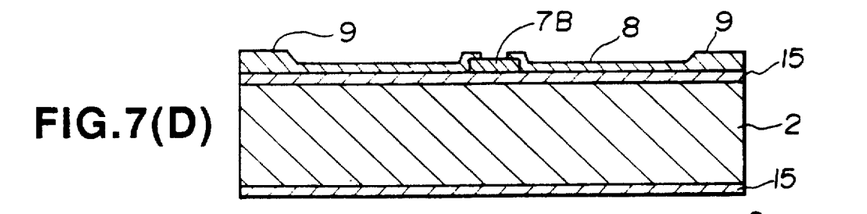
Figure 7E:
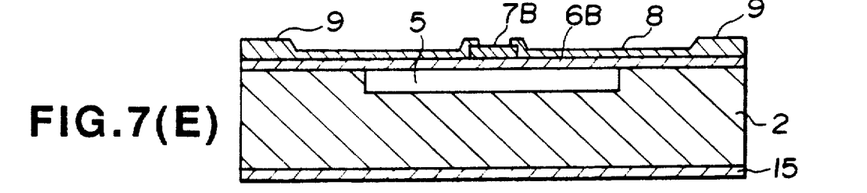
Figure 7F:
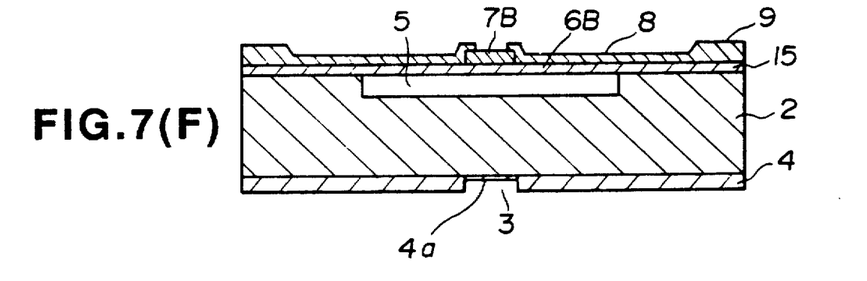

Next, after the silicon oxynitride film 15 formed on the front surface 2a of the silicon substrate 2 was removed by etching, the infrared ray reflecting film 4 was formed on the front surface 2a of the silicon substrate 2 by, for example, deposition, as shown in FIG. 7(F). The infrared ray reflecting film 4 may be made of platinum. Thereafter, the infrared ray transmitting window portion 3 was formed in the infrared ray reflecting film 4 by the known photolithographic technique at a position where it faces the infrared ray detecting element 7B on the bridge 6B. The coefficient B was about 4000K.

Figure 8:
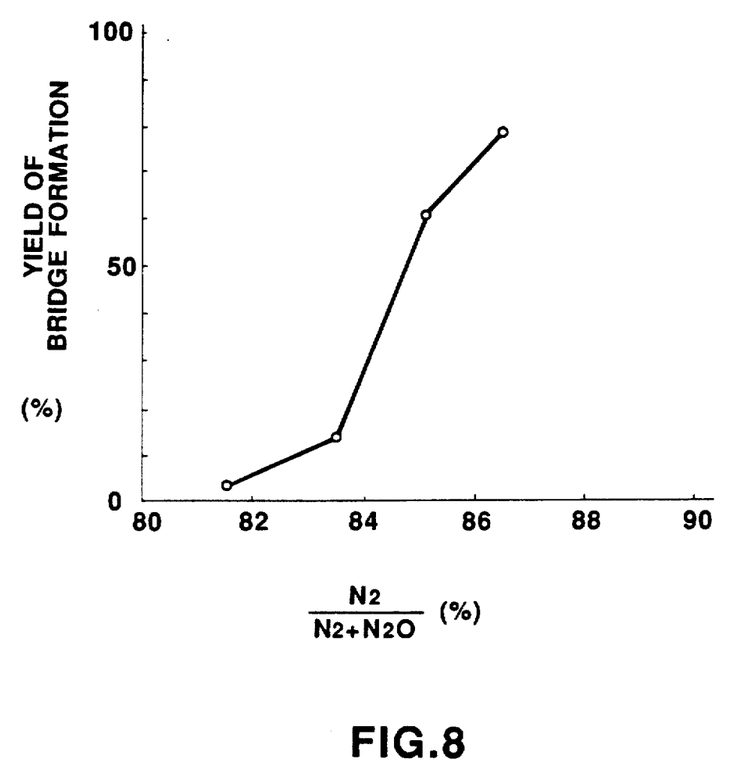
FIG. 8 shows the relationship between the gas flow rate ratio and yield of bridge formation.

FIG. 8 shows the relationship between the gas flow rateratio ($N_2/(N_2+N_2O)$) when the silicon oxynitride 15 is formed and the yield of the bridge formation. As can be seen from the graph, the highest yield was obtained when the flow rate ratio was 0.865. At the time, the efficiency was about 75%. At a flow rate ratio of 0.870 or above, the silicon substrate 2 was curved after annealing which was conducted at 500° C.

In case that amorphous silicon is used as infrared ray detecting elements, the manufacturing process in FIGS. 7(C)~7(E) is as follows;

The infrared ray detecting element 7B shown in FIG. 7(C) was respectively formed on the bridges 6A and 6B at the central portion thereof. That is, an amorphous silicon (a-Si) was formed on the silicon oxynitride film 15 and the silicon substrate 2 by conducting sputtering using silicon as the target. Argon (Ar) and hydrogen ($H_2$) were used at the flow rate of 2 SCCM and 1 SCCM. The pressure was $3 \times 10^{-3}$ Torr, and the high-frequency output was 200 W. Sputtering continued for ten minutes.

Next, annealing was conducted at 1100° C. for 20 minutes to make amorphous silicon polycrystalline. Subsequently, the polycrystralline silicon film was patterned by reactive ion etching. Therefore, the electrode pads 9 shown in FIG. 7(D) were formed by forming an aluminum film on the surface of the silicon substrate 2 by vapor deposition and then by patterning the film.

Next, the silicon substrate 2 located below the bridges 6A and 6B was selectively removed by etching to form the hole portion 5 shown in FIG. 7(E). The etching was anisotropic etching which used aqueous solution of hydrogine. This anisotropic etching may also use aqueous solution of potassium hydroxide.

Next, after the silicon oxynitride film 15 formed on the front surface 2a of the silicon substrate 2 was removed by etching, the infrared ray reflecting film 4 was formed on the front surface 2a of the silicon substrate 2 by, for example, deposition, as shown in FIG. 7(F). The infrared ray reflecting film 4 may be made of platinum. Thereafter, the infrared ray transmitting window portion 3 was formed in the ray reflecting film 4 by the known photolithographic technique at a position where it faces the infrared ray detecting element 7B on the bridge 6B. In this case, the coeficient B was about 3500K.

The case that amorphous germanium is used, annealing may be not conducted. Also, annealing at more than 500° C., is not desired. If annealing is conducted its temperature, the film 4a comes off. There is an advantage in the case that amorphous germanium is used. The advantage is that the electrode can be previously formed because of the low anneal temperature.

The present embodiments are illustrative and not restrictive, and various changes in the present invention may therefore be resorted to without departing from the spirit of essential characteristics thereof. For example, in the above-described embodiments, the bridges 6A and 6B have a linear configuration and are supported at the two points. However, they may be supported at three points in order to increase the strength thereof. Also, the bridges 6A and 6B are formed flat on the surface of the silicon substrate 2 in the above embodiments. However, they may have an arcuate form.

In the above-described embodiments, the silicon substrate 2 was used as the sensor substrate which transmits infrared radiation. However, a germanium substrate may also be used. Furthermore, the surface 2a of the silicon substrate 2 may be formed in a lens-like shape so that the infrared radiation which enters the infrared ray transmitting window portion 3 is converged to the infrared ray detecting element 7B. Furthermore, three or more infrared ray detecting elements may be provided.

Furthermore, in the above-described embodiments, the bridges 6A and 6B were formed of silicon oxynitride. However, it may be made of silicon oxide or silicon nitride.

Alternatively, the bridges 6A and 6B may have a multi-layer structure.

What is claimed is:

1. An infrared ray sensor comprising:
 a sensor substrate formed of an infrared ray transmitting material and having a first surface and a second surface which is in opposed relation to said first surface;
 an infrared ray reflecting film provided on said first surface of said sensor substrate;
 an infrared ray detecting element provided on said second surface of said sensor substrate;
 an infrared ray transmitting window portion formed in said infrared ray reflecting film in relation to said infrared ray detecting element, whereby an infrared ray which enters said infrared ray transmitting window portion passes through said sensor substrate and is then incident on said infrared ray detecting element.

2. An infrared ray sensor according to claim 1, wherein two or more infrared ray detecting elements are provided on said second surface or said sensor substrate, and wherein said infrared ray transmitting window portion is formed at a position in said infrared ray reflecting film to allow the infrared ray to enter a specified one of said two or more infrared ray detecting elements .

3. An infrared ray sensor according to claim 2, further comprising a plurality of bridges formed on said second surface of said sensor substrate, said infrared ray detecting elements being respectively provided on said plurality of bridges, one on each bridge.

4. An infrared ray sensor according to either of claims 2 or 3, further comprising electrode pads formed on said second surface of said sensor substrate, said electrode pads being electrically connected to said infrared ray detecting elements.

5. An infrared ray sensor according to claim 4, further comprising a terminal substrate having conductive layers at positions corresponding to said electrode pads on said sensor substrate and electrode terminals respectively connected to said conductive layers, said sensor substrate being fixed to said terminal substrate in a state wherein said electrode pads are joined to said conductive layers of said terminal substrate.

6. An infrared ray sensor according to claim 5, wherein a surface of said terminal substrate to which said sensor substrate is joined has a hole portion, the surrounding of said hole portion being sealed when said sensor substrate is joined to said terminal substrate.

7. An infrared ray sensor according to claim 6, wherein said infrared ray reflecting film comprises a metal film.

8. An infrared ray sensor according to claims 7, wherein said infrared ray transmitting material comprises silicon.

9. An infrared ray sensor according to claim 8, wherein said infrared ray transmitting material comprises germanium.

10. An infrared sensor according to claim 9, wherein said bridges are made of silicon oxynitride film.

11. An infrared ray sensor according to claim 10, wherein said silicon oxynitride film has a thickness ranging from 0.1 to 50 μm.

12. An infrared ray sensor according to claim 1, further comprising an electrode pad formed on said second surface of said sensor substate, said electrode pad being electrically connected to said infrared ray detecting element.

13. An infrared ray sensor comprising:

a sensor substrate formed of a semiconductor material;
a bridge formed of a silicon oxynitride film, said bridge being provided on said sensor substrate; and
an infrared ray detecting element provided on said bridge.

14. A method of manufacturing an infrared ray sensor, comprising the steps of:

forming a silicon oxynitride film by causing a reactive gas to flow on a semiconductor substrate;
patterning said silicon oxynitride film; and
forming a hole portion by selectively removing a portion of said semiconductor substrate located below said patterned silicon oxynitride film so as to form a bridge made of the silicon oxynitride film.

15. A method of manufacturing an infrared ray sensor according to claim 14, wherein a composition of said silicon oxynitride film is changed in accordance with a coefficient of thermal expansion of said semiconductor substrate by changing a gas flow rate ratio of said reactive gas.

* * * * *